United States Patent
Dow et al.

(10) Patent No.: US 7,427,894 B2
(45) Date of Patent: Sep. 23, 2008

(54) DUAL-MODE, DUAL-LOAD HIGH EFFICIENCY RF POWER AMPLIFIER

(75) Inventors: Gee Samuel Dow, Los Altos, CA (US); Chien-Lung Ho, San Jose, CA (US)

(73) Assignee: Avago Technologies Wireless IP (Singapore) Pte Ltd., Singapore (SG)

( * ) Notice: Subject to any disclaimer, the term of this patent is extended or adjusted under 35 U.S.C. 154(b) by 118 days.

(21) Appl. No.: 11/634,060

(22) Filed: Dec. 6, 2006

(65) Prior Publication Data

US 2008/0136512 A1 Jun. 12, 2008

(51) Int. Cl.
*H03F 1/14* (2006.01)
*H03G 3/20* (2006.01)

(52) U.S. Cl. .......................................... 330/51; 330/129
(58) Field of Classification Search .................. None
See application file for complete search history.

(56) References Cited

U.S. PATENT DOCUMENTS

| | | | |
|---|---|---|---|
| 6,208,202 B1 * | 3/2001 | Kaufman et al. | 330/51 |
| 6,794,935 B2 * | 9/2004 | Klomsdorf et al. | 330/129 |
| 6,806,767 B2 * | 10/2004 | Dow | 330/51 |
| 6,900,692 B2 * | 5/2005 | Kim et al. | 330/51 |
| 6,972,618 B2 * | 12/2005 | Kim et al. | 330/51 |
| 7,023,270 B2 * | 4/2006 | Kim et al. | 330/51 |
| 7,049,886 B2 * | 5/2006 | Kim et al. | 330/51 |
| 7,202,736 B1 * | 4/2007 | Dow et al. | 330/129 |
| 7,315,204 B2 * | 1/2008 | Seven | 330/51 |
| 7,315,205 B2 * | 1/2008 | Kim et al. | 330/51 |
| 7,348,841 B2 * | 3/2008 | Kim et al. | 330/51 |
| 2007/0018720 A1 * | 1/2007 | Wright | 330/51 |
| 2007/0080750 A1 * | 4/2007 | Liebenrood | 330/252 |
| 2007/0270111 A1 * | 11/2007 | Pan | 455/127.1 |
| 2008/0007327 A1 * | 1/2008 | Kim et al. | 330/51 |

* cited by examiner

*Primary Examiner*—Robert J. Pascal
*Assistant Examiner*—Krista M Flanagan

(57) ABSTRACT

A radio frequency (RF) amplifier has a driver device, an output device, and first and second impedance transformation networks. In a first operating mode the output device is turned on and the first impedance transformation network presents a first load impedance to the output device. In a second operating mode, the output device is turned off and the second impedance transformation network connects an output of the driver device to the first impedance transformation network and presents a second load impedance to the driver device. The second load impedance is greater than the first load impedance.

20 Claims, 2 Drawing Sheets

DUAL-MODE, DUAL-LOAD HIGH EFFICIENCY RF POWER AMPLIFIER

BACKGROUND

Radio Frequency (RF) amplifiers are used in a variety of devices, including mobile communications devices such as mobile telephones. In particular, an RF power amplifier is employed to amplify and transmit an RF signal from a mobile communication device.

The required time between battery charges is one important performance specification for a mobile communication device. Meanwhile, an RF power amplifier that transmits the output signal from a mobile communication device often represents the largest power drain on the mobile device's power supply (e.g., a battery). As a result, the required time between charges can be lengthened if the efficiency of the RF power amplifier could be improved.

Therefore, to reduce power consumption, some mobile communication devices exercise some form of control over the output power of the RF power amplifier. In particular, when the mobile communication device is operating somewhat far away from a base station, the device may operate in a "high power" mode wherein the RF output power level is set at or near its maximum value. On the other hand, when the mobile communication device is operating somewhat close to a base station, the device may operate in a "low power" mode wherein the RF output power level is set at a reduced level. Variations of this "dual-mode" operation are possible, for example, where the current battery voltage level and the remaining battery capacity are also taken into consideration when switching between operating modes.

When the RF power amplifier is switched into the "low power" mode, it consumes less current from the battery than when it operates in the "high power" mode. Therefore, when the RF power amplifier is switched to the "low power" mode, the mobile communication device is able to conserve battery power and thereby extend the required time between charges.

However, in a typical arrangement, in the low power mode the operating efficiency of the RF power amplifier is reduced to a significant degree. For the same output power level, when the efficiency of the RF power amplifier is decreased, this means that more wasted current is drawn from the battery. So although the low power mode conserves battery power and thereby extends the required time between charges, it could provide an even greater benefit if the operating efficiency in the low power mode could be improved.

What is needed, therefore, is an RF amplifier that can operate in both a high output power mode and a low output mode with high efficiency. What is also needed is an RF amplifier that can provide good impedance matching for its active device(s) when operating in both a high output power mode and a low output mode. What is further needed is a method of RF amplification that can operate in both a high output power mode and a low output mode with high efficiency.

SUMMARY

In an example embodiment, a radio frequency (RF) amplifier for providing an output signal to a load, comprises: a first impedance transformation network having an input and having an output connected to the load; an output amplifier stage having an input and having an output connected to an input of the first impedance transformation network; a driver amplifier stage adapted to receive an RF input signal and to amplify the RF input signal; and a switching circuit adapted to provide the amplified RF signal to the input of the output amplifier stage in response to a mode select signal having a first state indicating a first mode, and adapted to provide the amplified RF signal to the input of the first impedance transformation network in response to the mode select signal having a second state indicating a second mode. The output amplifier stage is turned on when the mode select signal has the first state, and is turned off when the mode select signal has the second state. The first impedance transformation network presents to the output amplifier stage a first load impedance at a frequency of the amplified RF signal when the mode select signal has the first state. The switching circuit presents to the driver amplifier stage a second load impedance at the frequency of the amplified RF signal when the mode select signal has the second state. The second load impedance is greater than the first load impedance In another example embodiment, a method of amplifying a radio frequency (RF) signal comprises: performing a first amplification on an RF input signal to produce a first amplified signal; in response to a mode select signal being in a first state indicating a first mode, performing a second amplification on the first amplified signal to produce a second amplified signal, and providing the second amplified signal to a first impedance transformation network connected to a load, wherein the first impedance transformation network presents at its input a first load impedance a frequency of the first amplified signal; and in response to the mode select signal being in a second state indicating a second mode, passing the first amplified signal through a second impedance transformation network, and providing the second amplified signal from the second impedance transformation network to the first impedance transformation network connected to a load. The second impedance transformation network presents at its input a second load impedance at the frequency of the first amplified signal when the mode select signal has the second state In yet another example embodiment, a radio frequency (RF) amplifier has a driver device, an output device, and first and second impedance transformation networks. In a first operating mode the output device is turned on and the first impedance transformation network presents a first load impedance to the output device. In a second operating mode, the output device is turned off and the second impedance transformation network connects an output of the driver device to the first impedance transformation network and presents a second load impedance to the driver device. The second load impedance is greater than the first load impedance

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

As used herein, the term "radio frequency" or "RF" pertains to VHF, UHF, microwave and even millimeter wave frequencies to the extent that technology permits the devices and circuits disclosed herein to be fabricated and operated at such frequencies. Also, unless otherwise noted, when a first device is said to be connected to a second device, this encompasses cases where one or more intermediate devices may be employed to connect the two devices to each other.

Figure 1:
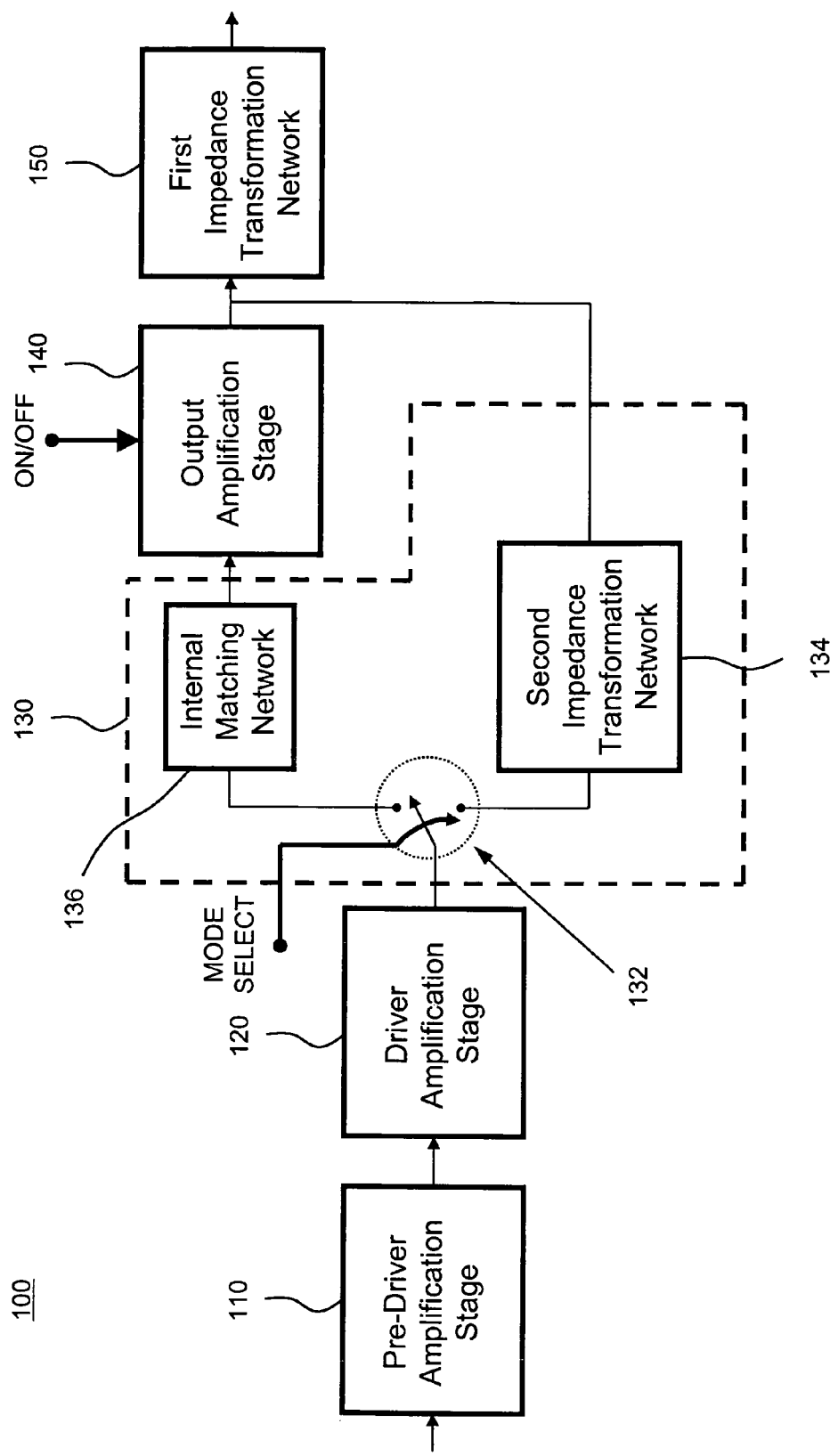
FIG. 1 shows a functional block diagram of one embodiment of a radio frequency (RF) amplifier.

FIG. 1 shows a functional block diagram of one embodiment of an RF amplifier 100. RF amplifier 100 includes: a pre-driver amplification stage 110, a driver amplification stage 120, a switching circuit 130, an output amplification stage 140, and a first impedance transformation network 150. Switching circuit 130 includes a switch 132, a second impedance transformation network 134, and an internal matching network 136. Switch 132 has first and second terminals and a control terminal responsive to a mode select signal. Output amplification stage 140 includes an ON/OFF control. The output of first impedance transformation network 150 is connected to a load (not shown in FIG. 1), which is not itself part of RF amplifier 100, and may comprise one or more antennas.

In a functional sense, RF amplifier 100 operates as follows. A pre-amplifier input signal is provided to an input of pre-driver amplification stage 110 from an external circuit, such as a modulator or lower-level amplifier. Pre-driver amplification stage 110 amplifies the pre-amplifier input signal to produce an RF input signal and provides the RF input signal to driver amplification stage 120. Driver amplification stage 120 amplifies the RF input signal to produce a first amplified signal and provides the first amplified signal to switching circuit 130.

Switching circuit 130 responds to a mode select signal to cause RF amplifier 100 to operate in one of two modes.

When the mode select signal has a first state (e.g., is a low voltage level such as 0 volts), then RF amplifier 100 operates in a first mode which is in this example, a "high power" mode. In the first (high power) mode, switching circuit 130 provides the first amplified RF signal to the input of the output amplification stage 140 through internal matching network 136. Internal matching network 136 operates to match an output impedance of driver amplification stage 120 to an input impedance of output amplification stage 140. In the idealized functional block diagram of FIG. 1, an impedance associated with switch 132 operating in a state where it provides the first amplified RF signal to the input of output amplification stage 140, may be considered as being subsumed within the functional block labeled internal matching network 136.

In the first (high power) mode, output amplification stage 140 amplifies the first amplified RF signal to produce a second amplified RF signal, and provides the second amplified RF signal to first impedance transformation network 150. The second amplified RF signal passes through first impedance transformation network 150 and is supplied as an RF output signal to a load (not shown in FIG. 1). In operation, first impedance transformation network 150 is adapted to transform the impedance of the load to present to output amplification stage 140 a first load impedance at a frequency of the RF signal.

Meanwhile, when the mode select signal has a second state (e.g., is a higher voltage level such as 2 volts), then RF amplifier 100 operates in a second mode which is in this example, a "low power" mode. In the second (low power) mode, switching circuit 130 provides the first amplified RF signal to the input of second impedance transformation network 134. Also, in this embodiment, in the second (low power) mode output amplification stage 140 is turned off. In that case, the first amplified RF signal from driver amplification stage 120 passes through second impedance transformation 134 network and is supplied from second impedance transformation network 134 to first impedance transformation network 150.

Second impedance transformation network 134 operates in conjunction with first impedance transformation network 150 to transform the impedance of the load to present to driver amplification stage 120 a second load impedance at a frequency of the RF signal. In the idealized functional block diagram of FIG. 1, an impedance associated with switch 132 operating in a state where it provides the first amplified RF signal to the input of second impedance transformation network 134 may be considered as being subsumed within second impedance transformation network 134.

In general, to obtain greater operating efficiency, it is desired to present the output of driver amplification stage 120, which operates at lower power levels, with a greater load impedance than the load impedance that is presented to output amplification stage 140, which operates at higher power levels. In that case, first and second impedance transformation networks 150 and 134 are configured such that the second load impedance presented to driver amplification stage 120 in the second (low power) mode is greater than the first load impedance presented to output amplification stage 140 in the first (high power) mode.

Many variations of the embodiment shown in FIG. 1 are possible. For example, in some configurations the RF signal level provided from an external circuit, such as a modulator, may be sufficient to drive driver amplification stage 120 directly. In that case, pre-driver amplification stage 110 can be eliminated. Also, a separate functional block for internal matching network 136 may not be required when impedances associated with physical elements of switch 132, driver amplification stage 120, and output amplification stage 140 provide an acceptable match between driver amplification stage 120 and output amplification stage 140.

As noted at the outset, FIG. 1 is just a functional block diagram of RF amplifier 100. The actual functions illustrated in FIG. 1 may be performed by circuits configured in a variety of configurations. Indeed, in a practical realization functions may overlap, and all or part of two or more illustrated functions may be performed by the same physical element(s) or circuit(s).

Figure 2:
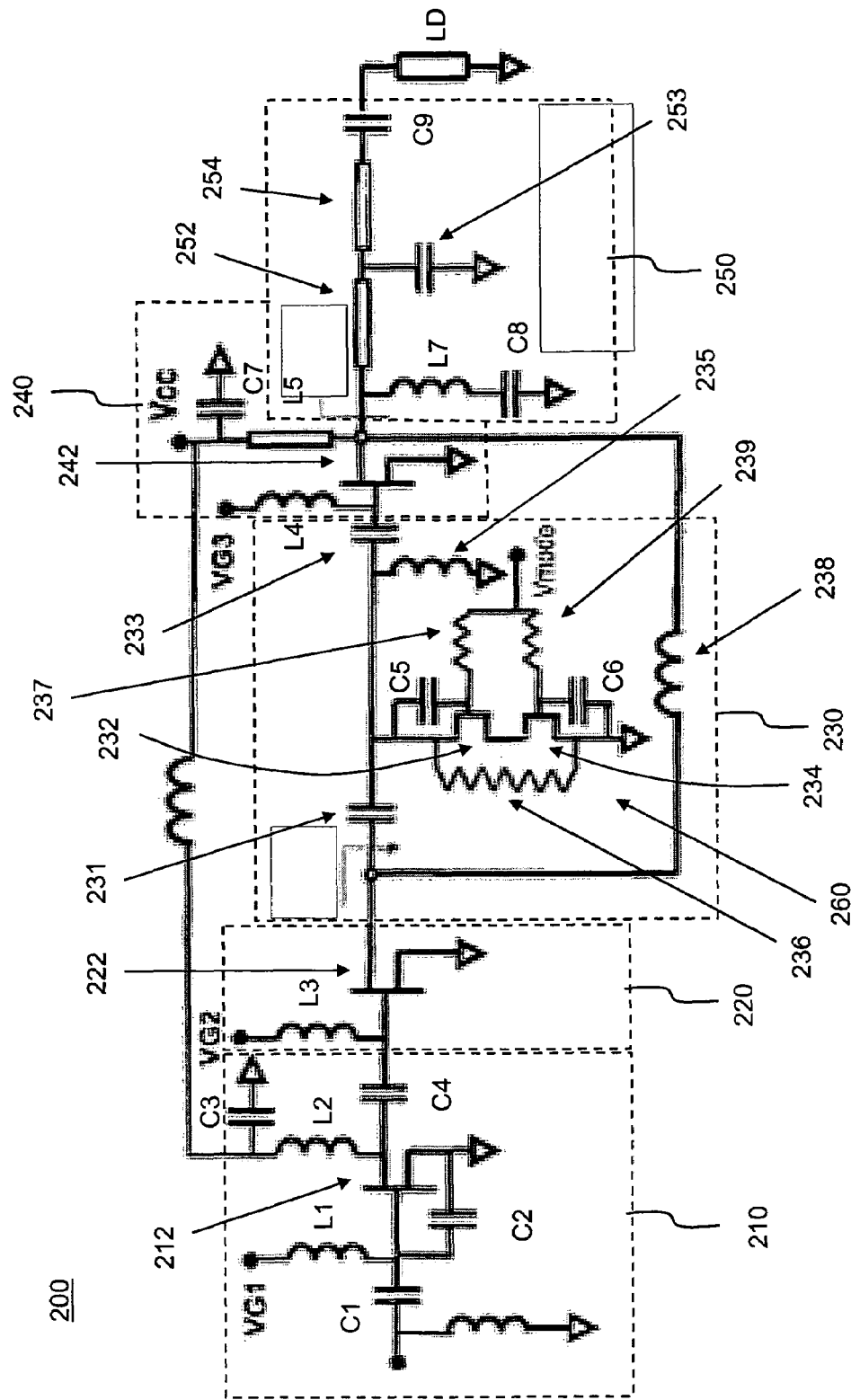
FIG. 2 shows a schematic diagram of one embodiment of an RF amplifier.

FIG. 2 shows a schematic diagram of one embodiment of an RF amplifier 200, which may implement the functions of the functional block diagram shown in FIG. 1.

RF amplifier 200 includes a pre-driver amplification stage 210, a driver amplification stage 220, a switching circuit 230, an output amplification stage 240, and a first impedance transformation network 250. The output of first impedance transformation network 250 is connected to a load LD, which is not itself part of RF amplifier 200, and may comprise one or more antennas. It should be understood as will be explained in more detail to follow, that the labels and boundary lines of various functional blocks shown in the schematic diagram of FIG. 2 are exemplary, and that many of the capacitors and inductors shown belonging to one functional block may alternatively be considered as belonging to an adjacent functional block.

As shown in FIG. 2, pre-driver amplification stage 210 includes a pre-driver device (field effect transistor (FET)) 212, together with an input capacitor C1, gate capacitor C2, a bias inductor L1, an inductor L2, an RF bypass capacitor C3, and an RF blocking capacitor C4. As explained above, for example, one could just as easily consider RF blocking capacitor C4 as belonging to the functional block for driver amplification stage 220 rather than belonging to the functional block for pre-driver amplification stage 210.

As shown in FIG. 2, driver amplification stage 220 includes a driver device (FET) 222 and inductor L3.

Switching circuit 230 includes: capacitors 231 and 233 provided in series between an output of driver amplification stage 220 and an input of output amplification stage 240; inductor 235 having a first end connected between capacitors 231 and 233, and a second end connected to ground; inductor 238 connected between an output of driver amplification stage 220 and an input of first impedance transformation network 250; and a switch 260 having first and second terminals and a control terminal. The control terminal is adapted to receive the mode select signal. The first terminal is connected between capacitors 231 and 235, and the second terminal being connected to ground. As explained above, for example, one could just as easily consider capacitor 233 as belonging to the functional block for output amplification stage 240 rather than belonging to the functional block for switching circuit 230.

In turn, switch 260 includes: first and second FETs 232 and 234 connected in series between the first and second terminals of switch 260; capacitors C5 and C6 corresponding to first and second FETs 232 and 234, each capacitor being connected between a gate and either a source or a drain of the corresponding FET; first and second resistors 237 and 238 corresponding to first and second FETs 232 and 234, each resistor being connected between a gate of the corresponding FET and the control terminal of switch 260; and a third resistor 236 connected in parallel with first and second FETs 232 and 234 between the first and second terminals of switch 260.

Output amplification stage 240 includes output device (FET) 242, inductor L4, RF choke L5, and bypass capacitor C7. Inductor L6 is connected to a bias voltage for output device 242 which can serve as an ON/OFF control for output amplification stage 240.

First impedance transformation network 250 includes: a second harmonic trap comprising L7 and C8; inductors 252 and 254 connected in series between the output of output amplification stage 240 and the load LD; a shunt capacitor 253 having a first end connected between inductors 252 and 254, and a second end connected to ground; and series capacitor C9. Series capacitor C9 is a DC-blocking capacitor, and may be considered to be separate from first impedance transformation network 250.

In general, to obtain greater operating efficiency, it is desired to present the output of driver device 222, which operates at lower power levels, with a greater load impedance than the load impedance that is presented to output device 242, which operates at higher power levels. In that case, first impedance transformation network 250 and switching circuit 230 are configured such that the second load impedance presented to driver device 122 in the second (low power) mode is greater than the first load impedance presented to output device 242 in the first (high power) mode.

The functional operation of RF amplifier 200 is generally the same as RF amplifier 100 which has been explained above, and so all of those details will not be repeated here, and instead only some specific details pertaining to the particular circuit elements of FIG. 2 will be discussed.

Switch 260 is a shunt FET switch located between driver device 222 and output device 242. In the first (high power) mode, a mode select signal having a first state (e.g., V=0V) is supplied to the input formed by the connection of resistors R1 and R2. In response thereto, FETs 232 and 234 are turned OFF and thus switch 260 is OFF. When switch 260 is turned OFF then an interstage matching circuit—which takes into account the OFF capacitance $C_{OFF}$ of switch 260—provides power transfer of the first amplified RF signal from driver device 222 to output device 242 which is turned ON. Output device 242 amplifies the first amplified RF signal to produce a second amplified RF signal. First impedance transformation network 250 presents a first load impedance to output device 242, and passes the second amplified RF signal as an RF output signal to the load LD.

In contrast, in the second (low power) mode, the mode select signal having a second state (e.g., V=2V) is supplied to the input formed by the connection of resistors R1 and R2. Also, in the second (low power) mode, output device 242 is turned OFF (biased OFF by VG3 in FIG. 2). In response to the mode select signal having the second state, FETs 232 and 234 are turned ON and thus switch 260 is ON. When switch 260 is turned ON then a second impedance transformation network including capacitor 231, inductor 231, and taking into account the ON capacitance $C_{ON}$ of switch 260, provides the first amplified RF signal to first impedance transformation network 250 and presents a second load impedance to driver device 222. The second load impedance is greater than the first load impedance. First impedance transformation network 250 passes the first amplified RF signal as an RF output signal to the load LD.

In switch 260, capacitors C5 and C6 are feed-forward capacitors that achieve voltage synchronization between the drain and gate of each of the FETs 232 and 234 and thereby increase the power handling capabilities of the shunt FETs. This improves the output power during the high power mode of operation.

In embodiments as described above, in a low power operating mode, efficiency is enhanced by including the second impedance transformation network that provides a high impedance load to the driver device.

In one exemplary embodiment of RF amplifier 200, the first load impedance seen by output device 244 in the high power mode is about 4 ohms, and the second load impedance seen by driver device 222 in the low power mode is between 15 to 20 ohms. In this exemplary embodiment the combined gain of RF amplifier 100 in the lower power mode is about 23 dB, while the gain in the high power mode is about 28 dB. Also, in this embodiment, the RF amplifier may achieve efficiencies of over 23% in the low power mode for input levels of −7 dBm. In contrast, to obtain the same output power level in the high power mode, the input power level would only have to be about −12 dBm, however the RF amplifier would be operating with a reduced efficiency of only about 8%. So it is seen that significant improvements can be obtained in operating efficiency when operating in the low power mode. This reduces the power drain on the battery in a mobile communication device, and thereby prolongs the required period of time between battery charges.

While example embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. A radio frequency (RF) amplifier for providing an output signal to a load, the RF amplifier comprising:
   a first impedance transformation network having an input and having an output connected to the load;
   an output amplifier stage having an input and having an output connected to an input of the first impedance transformation network;
   a driver amplifier stage adapted to receive an RF input signal and to amplify the RF input signal; and
   a switching circuit adapted to provide the amplified RF signal to the input of the output amplifier stage in response to a mode select signal having a first state indicating a first mode, and adapted to provide the amplified RF signal to the input of the first impedance transformation network in response to the mode select signal having a second state indicating a second mode,
   wherein the output amplifier stage is turned on when the mode select signal has the first state, and is turned off when the mode select signal has the second state,
   wherein the first impedance transformation network presents to the output amplifier stage a first load impedance at a frequency of the amplified RF signal when the mode select signal has the first state, and
   wherein the switching circuit presents to the driver amplifier stage a second load impedance at the frequency of the amplified RF signal when the mode select signal has the second state, where the second load impedance is greater than the first load impedance.

2. The RF amplifier of claim 1, wherein the switching circuit comprises a second impedance transformation network connected to the input of the first impedance transformation network.

3. The RF amplifier of claim 1, further comprising a pre-driver amplifier stage adapted to receive and amplify a pre-amplifier input signal to produce the RF input signal and to provide the RF input signal to the driver amplifier stage.

4. The RF amplifier of claim 1, further comprising a bias input adapted to turn on the output amplifier stage when the mode select signal has the first state, and adapted to turn off the output amplifier stage when the mode select signal has the second state.

5. The RF amplifier of claim 1, wherein the switching circuit comprises:
   first and second series capacitors provided in series between an output of the driver amplifier stage and an input of the output amplifier stage;
   an inductance element having a first end connected between the first and second capacitors, and a second end connected to ground;
   a switch having first and second terminals and a control terminal, the control terminal being adapted to receive the mode select signal, the first terminal being connected between the first and second capacitors, and the second terminal being connected to ground; and
   a second inductance element connected between an output of the driver amplifier stage and an input of the first impedance transformation network.

6. The RF amplifier of claim 5, wherein the switch comprises:
   first and second field effect transistors (FETs) connected in series between the first and second terminals of the switch;
   first and second switch capacitors corresponding to the first and second FETs, each switch capacitor being connected between a gate and one of a source and a drain of the corresponding FET;
   first and second resistors corresponding to the first and second FETs, each resistor being connected between a gate of the corresponding FET and the control terminal of the switch; and
   a third resistor connected in parallel with the first and second FETs between the first and second terminals of the switch.

7. The RF amplifier of claim 1, wherein the first impedance transformation network comprises:
   first and second inductance elements connected in series between the output of the output amplifier and the load; and
   a shunt capacitor having a first end connected between the first and second inductance elements, and a second end connected to ground.

8. A method of amplifying a radio frequency (RF) signal, comprising:
   performing a first amplification on an RF input signal to produce a first amplified signal;
   in response to a mode select signal being in a first state indicating a first mode,
      performing a second amplification on the first amplified signal to produce a second amplified signal, and
      providing the second amplified signal to a first impedance transformation network connected to a load, wherein the first impedance transformation network presents at its input a first load impedance at a frequency of the first amplified signal; and
   in response to the mode select signal being in a second state indicating a second mode,
      passing the first amplified signal through a second impedance transformation network, and
      providing the second amplified signal from the second impedance transformation network to the first impedance transformation network connected to a load,
   wherein the second impedance transformation network presents at its input a second load impedance at the frequency of the first amplified signal when the mode select signal has the second state.

9. The method of claim 8, further comprising performing a pre-amplification on a pre-amplifier input signal to produce the RF input signal.

10. The method of claim 8, further comprising, when the mode select signal is in the second state indicating the second mode, turning off an output amplifier used for performing the second amplification.

11. The method of claim 8, wherein performing the second amplification on the first amplified signal to produce the second amplified signal in response to the mode select signal being in the first state, comprises:
   turning off a shunt switch to provide the first amplified signal to an output amplification stage for performing the second amplification.

12. The method of claim 11, wherein passing the first amplified signal through the second impedance transformation network in response to the mode select signal being in the second state, comprises:
   turning on the shunt switch to provide the first amplified signal to the second impedance transformation network.

13. A radio frequency (RF) amplifier having a driver device, an output device, and first and second impedance transformation networks, wherein in a first operating mode the output device is turned on and the first impedance transformation network presents a first load impedance to the output device, and in a second operating mode, the output device is turned off and the second impedance transformation network connects an output of the driver device to the first impedance transformation network and presents a second load impedance to the driver device, where the second load impedance is greater than the first load impedance.

14. The RF amplifier of claim 13, including a shunt switch having first and second terminals and a control terminal, the control terminal being adapted to receive a mode select signal, the first terminal being connected between the driver device and output device, and the second terminal being connected to ground.

15. The RF amplifier of claim 14, wherein the second impedance transformation network includes an impedance of the shunt switch.

16. The RF amplifier of claim 14, wherein the shunt switch includes a dual-gate field effect transistor (FET) having a feed-forward circuit.

17. The RF amplifier of claim 13, including a pre-driver device providing an input to the driver device.

18. The RF amplifier of claim 13, wherein the first impedance transformation network comprises:

first and second inductance elements connected in series between the output of the output amplifier and a load; and a shunt capacitor having a first end connected between the first and second inductance elements, and a second end connected to ground.

19. The RF amplifier of claim 13, wherein the second impedance transformation network comprises:

first and second capacitors provided in series between the driver device and the output device;

an inductance element having a first end connected between the first and second capacitors, and a second end connected to ground;

a switch having first and second terminals and a control terminal, the control terminal being adapted to receive a mode select signal, the first terminal being connected between the first and second capacitors, and the second terminal being connected to ground; and a second inductance element connected between an output of the driver device and an input of the first impedance transformation network.

20. The RF amplifier of claim 13, wherein the RF amplifier is switched between the first operating mode and the second operating mode in response to a mode selection signal.

* * * * *